(12) United States Patent
Humayun et al.

(10) Patent No.: US 8,367,546 B2
(45) Date of Patent: *Feb. 5, 2013

(54) METHODS FOR FORMING ALL TUNGSTEN CONTACTS AND LINES

(75) Inventors: Raashina Humayun, Fremont, CA (US); Kaihan Ashtiani, Cupertino, CA (US); Karl B. Levy, Los Altos, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/276,170

(22) Filed: Oct. 18, 2011

(65) Prior Publication Data

US 2012/0040530 A1 Feb. 16, 2012

Related U.S. Application Data

(63) Continuation of application No. 11/963,698, filed on Dec. 21, 2007, now Pat. No. 8,053,365.

(51) Int. Cl.
*H01L 21/302* (2006.01)

(52) U.S. Cl. ........ 438/675; 438/653; 438/654; 438/643; 438/648; 438/656; 257/486; 257/751; 257/763; 257/E21.168; 257/E21.592; 257/E21.476

(58) Field of Classification Search .............. 438/653, 438/654, 643, 648, 656; 257/486, 751, 763, 257/E21.168, E21.592, E21.476
See application file for complete search history.

(56) References Cited

U.S. PATENT DOCUMENTS

| 4,746,375 A | 5/1988 | Lacovangelo |
| 4,804,560 A | 2/1989 | Shioya et al. |
| 4,874,719 A | 10/1989 | Kurosawa |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,926,720 A | 7/1999 | Zhao et al. |

(Continued)

FOREIGN PATENT DOCUMENTS

| WO | WO01/27347 | 4/2001 |
| WO | 2010/025357 | 3/2010 |

OTHER PUBLICATIONS

Ken K. Lai and H. Henry Lamb, Precursors for Organometallic Chemical Vapor Deposition of Tungsten Carbide Films, 1995, Chemistry Material, pp. 2284-2292.*

(Continued)

*Primary Examiner* — Julio J Maldonado
*Assistant Examiner* — Hajar Kolahdouzan
(74) *Attorney, Agent, or Firm* — Weaver Austin Villeneuve & Sampson LLP (57) ABSTRACT

Novel low-resistivity tungsten film stack schemes and methods for depositing them are provided. The film stacks include a mixed tungsten/tungsten-containing compound (e.g., WC) layer as a base for deposition of tungsten nucleation and/or bulk layers. According to various embodiments, these tungsten rich layers may be used as barrier and/or adhesion layers in tungsten contact metallization and bitlines. Deposition of the tungsten-rich layers involves exposing the substrate to a halogen-free organometallic tungsten precursor. The mixed tungsten/tungsten carbide layer is a thin, low resistivity film with excellent adhesion and a good base for subsequent tungsten plug or line formation.

20 Claims, 8 Drawing Sheets

U.S. PATENT DOCUMENTS

| | | | |
|---|---|---|---|
| 5,956,609 | A | 9/1999 | Lee et al. |
| 6,001,729 | A | 12/1999 | Shinriki et al. |
| 6,017,818 | A | 1/2000 | Lu |
| 6,037,263 | A * | 3/2000 | Chang .......................... 438/712 |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,429,126 | B1 | 8/2002 | Herner et al. |
| 6,465,347 | B2 | 10/2002 | Ishizuka et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,905,543 | B1 | 6/2005 | Fair et al. |
| 6,908,848 | B2 | 6/2005 | Koo |
| 6,936,538 | B2 | 8/2005 | Byun |
| 6,939,804 | B2 | 9/2005 | Lai et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,211,144 | B2 | 5/2007 | Lu et al. |
| 7,220,671 | B2 | 5/2007 | Simka et al. |
| 7,262,125 | B2 | 8/2007 | Wongsenakhum et al. |
| 7,416,979 | B2 | 8/2008 | Yoon et al. |
| 7,429,402 | B2 | 9/2008 | Gandikota et al. |
| 7,589,017 | B2 | 9/2009 | Chan et al. |
| 7,655,567 | B1 | 2/2010 | Gao et al. |
| 7,691,749 | B2 | 4/2010 | Levy et al. |
| 7,754,604 | B2 | 7/2010 | Wongsenakhum et al. |
| 7,772,114 | B2 | 8/2010 | Chan et al. |
| 7,955,972 | B2 | 6/2011 | Chan et al. |
| 8,048,805 | B2 | 11/2011 | Chan et al. |
| 8,053,365 | B2 | 11/2011 | Humayun et al. |
| 8,058,170 | B2 | 11/2011 | Chandrashekar et al. |
| 8,062,977 | B1 | 11/2011 | Ashtiani et al. |
| 8,101,521 | B1 | 1/2012 | Gao et al. |
| 8,207,062 | B2 | 6/2012 | Gao et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 * | 6/2003 | Fang et al. ............. 427/255.392 |
| 2003/0127043 | A1 | 7/2003 | Lu et al. |
| 2004/0014315 | A1 | 1/2004 | Lai et al. |
| 2004/0044127 | A1 | 3/2004 | Okubo et al. |
| 2004/0142557 | A1 | 7/2004 | Levy et al. |
| 2004/0202786 | A1 | 10/2004 | Wongsenakhum et al. |
| 2004/0206267 | A1 | 10/2004 | Sambasivan et al. |
| 2005/0031786 | A1 | 2/2005 | Lee et al. |
| 2005/0059236 | A1 | 3/2005 | Nishida et al. |
| 2005/0136594 | A1 | 6/2005 | Kim |
| 2006/0003581 | A1 | 1/2006 | Johnston et al. |
| 2006/0094238 | A1 | 5/2006 | Levy et al. |
| 2007/0099420 | A1 | 5/2007 | Dominquez et al. |
| 2007/0190780 | A1 | 8/2007 | Chung et al. |
| 2008/0081127 | A1 | 4/2008 | Thompson et al. |
| 2008/0124926 | A1 | 5/2008 | Chan et al. |
| 2008/0254623 | A1 | 10/2008 | Chan et al. |
| 2008/0280438 | A1 | 11/2008 | Lai et al. |
| 2009/0163025 | A1 | 6/2009 | Humayun et al. |
| 2010/0035427 | A1 | 2/2010 | Chan et al. |
| 2010/0055904 | A1 | 3/2010 | Chen et al. |
| 2010/0159694 | A1 | 6/2010 | Chandrashekar et al. |
| 2010/0267230 | A1 | 10/2010 | Chandrashekar et al. |
| 2010/0267235 | A1 | 10/2010 | Chen et al. |
| 2010/0273327 | A1 | 10/2010 | Chan et al. |
| 2011/0059608 | A1 | 3/2011 | Gao et al. |
| 2011/0156154 | A1 | 6/2011 | Hoentschel et al. |
| 2011/0221044 | A1 | 9/2011 | Danek et al. |
| 2011/0223763 | A1 | 9/2011 | Chan et al. |
| 2012/0015518 | A1 | 1/2012 | Chandrashekar et al. |
| 2012/0199887 | A1 | 8/2012 | Chan et al. |

OTHER PUBLICATIONS

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

Wongsenakhum et al., "Method of Forming Low-Resistivity Tungsten Interconnects," Novellus Systems, Inc., U.S. Appl. No. 10/815,560, filed Mar. 31, 2004.

U.S. Office Action mailed Jul. 12, 2005, from U.S. Appl. No. 10/815,560.

Lee et al., "Method for Producing Ultra Thin Tungsten Layer With Improved Step Coverage," Novellus Systems, Inc., U.S. Appl. No. 09/975,074, filed Oct. 9, 2001.

U.S. Office Action mailed Jul. 17, 2002, from U.S. Appl. No. 09/975,074.

Lee et al., "Method for Producing Ultra Thin Tungsten Layer With Improved Step Coverage," Novellus Systems, Inc., U.S. Appl. No. 10/649,351, filed Aug. 26, 2003.

U.S. Office Action mailed Feb. 8, 2005, from U.S. Appl. No. 10/649,351.

U.S. Final Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

Fair et al., "Selective Refractory Metal and Nitride Capping," Novellus Systems, Inc., U.S. Appl. No. 10/435,010, filed May 9, 2003.

U.S. Office Action mailed Jun. 22, 2004, from U.S. Appl. No. 10/435,010.

Levy et al., "Deposition of Tungsten Nitride," Novellus Systems, Inc., U.S. Appl. No. 10/690,492, filed Oct. 20, 2003.

U.S. Office Action mailed Mar. 23, 2005, from U.S. Appl. No. 10/690,492.

Fair et al., "Selective Refractory Metal and Nitride Capping," Novellus Systems, Inc., U.S. Appl. No. 10/984,126, filed Nov. 8, 2004.

U.S. Office Action mailed Nov. 23, 2005, from U.S. Appl. No. 10/984,126.

Levy et al., "Deposition of Tungsten Nitride", Novellus Systems, Inc., filed Dec. 16, 2005, U.S. Appl. No. 11/305,368, pp. 1-39.

U.S. Final Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Final Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074, Mar. 2003.

Notice of Allowance and Fee Due mailed Jul. 21, 2006, from U.S. Appl. No. 10/649,351.

Allowed Claims from U.S. Appl. No. 10/649,351, Jul. 2006.

Notice of Allowance and Fee Due mailed Oct. 7, 2004, from U.S. Appl. No. 10/435,010.

Allowed Claims from U.S. Appl. No. 10/435,010, Oct. 2004.

Notice of Allowance and Fee Due mailed Aug. 25, 2006, from U.S. Appl. No. 10/984,126.

Allowed Claims from U.S. Appl. No. 10/984,126, Aug. 2006.

Notice of Allowance and Fee Due mailed Sep. 14, 2005, from U.S. Appl. No. 10/690,492.

Allowed Claims from U.S. Appl. No. 10/690,492, Sep. 2005.

Notice of Allowance and Fee Due mailed Apr. 24, 2007, from U.S. Appl. No. 10/815,560.

Allowed Claims from U.S. Appl. No. 10/815,560, Apr. 2007.

U.S. Office Action mailed Jun. 27, 2008, from U.S. Appl. No. 11/305,368.

Chan et al., "Methods for Growing Low-Resistivity Tungsten Film," Novellus Systems, Inc., U.S. Appl. No. 11/265,531, filed Nov. 1, 2005.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531, May 2009.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

Ken K. Lai and H. Henry Lamb, Precursors for Organometallic Chemical Vapor Deposition of Tungsten Carbide Films, 1995, Chemistry Material, pp. 2284-2292.

U.S. Office Action mailed Jun. 24, 2009 from U.S. Appl. No. 12/030,645.

U.S. Office Action mailed Aug. 5, 2009, from U.S. Appl. No. 11/951,236.

Ashtiani et al., "Ternary Tungsten-Containing Resistive Thin Films," Novellus Systems, Inc., U.S. Appl. No. 12/363,330, filed Jan. 30, 2009.

Chandrashekar et al., "Method for Depositing Thin Tungsten Film With Low Resistivity And Robust Micro-Adhesion Characteristics," Novellus Systems, Inc., U.S. Appl. No. 12/407,541, filed Mar. 19, 2009.

U.S. Office Action mailed Oct. 21, 2009 from U.S. Appl. No. 12/202,126.

U.S. Notice of Allowance mailed Nov. 17, 2009 from U.S. Appl. No. 11/305,368.

Allowed Claims from U.S. Appl. No. 11/305,368, Nov. 2009.

U.S. Final Office Action mailed Nov. 20, 2009 from U.S. Appl. No. 11/349,035.

U.S. Final Office Action mailed Dec. 9, 2009 from U.S. Appl. No. 11/963,698.

U.S. Notice of Allowance mailed Sep. 17, 2009 from U.S. Appl. No. 11/782,570.

Allowed Claims from U.S. Appl. No. 11/782,570, Sep. 2009.

Chan et al., "Methods for Growing Low-Resistivity Tungsten Filml", Novellus Systems Inc., U.S. Appl. No. 12/538,770, filed Aug. 10, 2009.

U.S. Final Office Action mailed Jan. 13, 2010 from U.S. Appl. No. 12/030,645.

Gao et al., "Method for Improving Adhesion of Low Resistivity Tungsten/Tungsten Nitride Layers," Novellus Systems, Inc., U.S. Appl. No. 12/556,490, filed Sep. 9, 2009.

Gao et al., "Methods for Improving Uniformity and Resistivity of Thin Tungsten Films," Novellus Systems, Inc, filed Dec. 11, 2009, U.S. Appl. No. 12/636,616.

U.S. Office Action mailed Jan. 26, 2010 from U.S. Appl. No. 11/951,236.

U.S. Notice of Allowance mailed Mar. 2, 2010 from U.S. Appl. No. 11/349,035.

Allowed Claims from U.S. Appl. No. 11/349,035, Mar. 2010.

Danek, et al, "Tungsten Barrier And Seed For Copper Filled TSV," Novellus Systems, Inc., filed Mar. 12, 2010, U.S. Appl. No. 12/723,532.

Chandrashekar, et al., "Method for Forming Tungsten Contacts and Interconnects with Small Critical Dimensions," Novellus Systems, Inc, filed Apr. 6, 2010, U.S. Appl. No. 12/755,248.

Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.

U.S. Notice of Allowance and Allowed Claims mailed Apr. 6, 2010 from U.S. Appl. No. 11/951,236.

U.S. Office Action mailed May 3, 2010 from U.S. Appl. No. 12/407,541.
U.S. Final Office Action mailed May 7, 2010 from U.S. Appl. No. 12/202,126.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Final Office Action mailed Jul. 23, 2010 from U.S. Appl. No. 12/030,645.
U.S. Office Action mailed Jul. 26, 2010 from U.S. Appl. No. 12/202,126.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Final Office Action for U.S. Appl. No. 11/963,698 mailed Dec. 30, 2010.
U.S. Office Action for U.S. Appl. No. 12/636,616 mailed Jan. 25, 2011.
U.S. Final Office Action mailed Feb. 7, 2011 from U.S. Appl. No. 12/202,126.
Notice of Allowance and Fee Due mailed Jan. 24, 2011, from U.S. Appl. No. 12/030,645.
Allowed Claims from U.S. Appl. No. 12/030,645 as of Jan. 24, 2011.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/407,541 mailed May 2, 2011.
U.S. Office Action for U.S. Appl. No. 12/755,248 mailed May 13, 2011.
U.S. Office Action for U.S. Appl. No. 12/556,490 mailed Jun. 14, 2011.
U.S. Final Office Action for U.S. Appl. No. 12/636,616 mailed Jun. 15, 2011.
Notice of Allowance for U.S. Appl. No. 12/538,770 mailed Jun. 30, 2011.
Allowed Claims as of Jun. 30, 2011, for U.S. Appl. No. 12/538,770.
U.S. Office Action for U.S. Appl. No. 12/829,119, mailed Jun. 30, 2011.
Notice of Allowance mailed Jul. 25, 2011, for U.S. Appl. No. 12/363,330.
Allowed Claims as of Jul. 25, 2011, for U.S. Appl. No. 12/363,330.
Korean First Notification of Provisional Rejection mailed Dec. 8, 2010, dated Application No. 2004-0036346.
Notice of Allowance mailed Sep. 2, 2011, for U.S. Appl. No. 11/963,698.
Allowed Claims as of Sep. 2, 2011, for U.S. Appl. No. 11/963,698.
Notice of Allowance mailed Sep. 19, 2011, for U.S. Appl. No. 12/407,541.
Allowed Claims as of Sep. 19, 2011, for U.S. Appl. No. 12/407,541.
Chan et al., "Methods of Controlling Tungsten Film Properties," Novellus Systems, Inc., U.S. Appl. No. 13/020,748, filed Feb. 3, 2011.
Chandrashckar et al., "Method for Depositing Thin Tungsten Film With Low Resistivity And Robust Micro-Adhesion Characteristics," Novellus Systems, Inc., U.S. Appl. No. 13/244,016, filed Sep. 23, 2011.
U.S. Office Action for U.S. Appl. No. 12/755,248 mailed Oct. 28, 2011.
Notice of Allowance for U.S. Appl. No. 12/636,616 mailed Sep. 30, 2011.
U.S. Final Office Action for U.S. Appl. No. 12/829,119, mailed Nov. 17, 2011.
U.S. Appl. No. 12/755,259, Office Action mailed Feb. 16, 2012.
Notice of Allowance for U.S. Appl. No. 12/556,490 mailed Mar. 2, 2012.
U.S. Office Action mailed May 10, 2012, issued in U.S. Appl. No. 13/020,748.
U.S. Office Action for U.S. Appl. No. 13/244,016, mailed Mar. 6, 2012.
U.S. Office Action for U.S. Appl. No. 12/829,119, mailed Apr. 19, 2012.
U.S. Final Office Action for U.S. Appl. No. 12/755,248 mailed Apr. 30, 2012.
Notification of Provisional Rejection mailed Jul. 17, 2012, for Application No. 2010-0087997.
Office Action for U.S. Appl. No. 13/095,734, mailed Aug. 6, 2012.
Notice of Allowance for U.S. Appl. No. 12/829,119, mailed Aug. 7, 2012.

* cited by examiner

METHODS FOR FORMING ALL TUNGSTEN CONTACTS AND LINES

CROSS-REFERENCE TO RELATED APPLICATION

This application is a continuation of and claims priority from U.S. patent application Ser. No. 11/963,698, filed Dec. 21, 2007, titled "METHODS FOR FORMING ALL TUNGSTEN CONTACTS AND LINES," all of which is incorporated herein by this reference.

BACKGROUND

Tungsten-containing films are used in multiple applications for semiconductor device fabrication. For example, metallic tungsten (W) is the primary conductor for contacts and vias. Metallic tungsten is also used in bit lines. The typical film stack in use today is PVD-Ti/CVD-TiN/W nucleation/CVD-W bulk, with the titanium (Ti)/titanium nitride (TiN) layers acting as liner or barrier films. However, various issues arise with depositing and using Ti/TiN films, especially as feature sizes decrease. PVD Ti liners create overhangs in the contact opening that can result in keyhole formation during plug fill and coring during chemical-mechanical polishing, ultimately affecting the contact resistance of very small features. In addition, as the TiN barrier is thinned to meet the scalabilty requirements its barrier properties are degraded and the underlying Ti and/or the contact material may be exposed to fluorine from the WF6 based tungsten deposition process. Plasma-assisted MOCVD TiN deposition processes suffer from inhomogeneous film properties and limited step coverage in high aspect-ratio features. While titanium tetrachloride ($TiCl_4$)-based Ti and TiN processes provide improved step coverage, they do so at deposition temperatures much greater than 400° C., which are incompatible with many processes.

SUMMARY OF INVENTION

Novel low-resistivity tungsten film stack schemes and methods for depositing them are provided. The film stacks include a tungsten rich layer having tungsten mixed with a low resistivity tungsten compound, e.g., tungsten carbide or tungsten nitride, as a base for deposition of tungsten nucleation and/or bulk layers. According to various embodiments, these tungsten rich layers may be used as barrier and/or adhesion layers in tungsten contact metallization and bitlines. Deposition of the tungsten-rich layers involves exposing the substrate to a halogen-free organometallic tungsten precursor. The mixed tungsten/tungsten carbide layer is a thin, low resistivity film with excellent adhesion and a good base for subsequent tungsten plug or line formation.

One aspect of the invention relates to a method of forming an all-tungsten plug. The method includes the operations of providing a semiconductor substrate comprising a contact hole in a dielectric layer, said contact hole exposing a conductive region; exposing the substrate to a non-halogen organometallic tungsten precursor and a reducing agent to thereby deposit a tungsten-rich barrier film on at least the exposed conductive region, wherein the tungsten-rich barrier film comprises a mixture of metallic tungsten and a tungsten carbide; exposing the substrate to a tungsten-containing precursor to deposit one or more tungsten layers on the tungsten-rich barrier film; and substantially or completely filling the hole with tungsten to form the tungsten plug. The tungsten-rich barrier layer is typically deposited as a thin conformal layer in the contact hole. In certain embodiments, depositing the tungsten layer(s) on the tungsten-rich barrier film involves using a halogen-containing tungsten precursor, e.g., $WF_6$. In other embodiments a physical or chemical preclean process is used before the deposition of the tungsten rich layer to clean the contact to enable ohmic contact to the underlying layer.

Another aspect of the invention relates to a method of forming an all-tungsten bitline. The method includes the operations of providing a semiconductor substrate comprising a contact hole in a dielectric layer, said contact hole exposing a conductive region; exposing the substrate to a non-halogen organometallic tungsten precursor and a reducing agent to thereby deposit a tungsten-rich barrier film on at least the exposed conductive region, wherein the tungsten-rich barrier film comprises a mixture of metallic tungsten and a tungsten carbide; exposing the substrate to a tungsten-containing precursor to deposit one or more tungsten layers on the tungsten-rich barrier film; and substantially or completely filling the hole with tungsten to form the tungsten plug. The tungsten-rich barrier layer is typically deposited as a thin conformal layer in the contact hole. In certain embodiments, depositing the tungsten layer(s) on the tungsten-rich barrier film involves using a halogen-containing tungsten precursor, e.g., $WF_6$.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the invention, which pertains to forming tungsten films. Preferred methods involve exposing a tungsten nucleation layer to pulses of a reducing agent, which will be described in detail below. Modifications, adaptations or variations of specific methods and of structures shown herein will be apparent to those skilled in the art and are within the scope of this invention.

Figure 1:
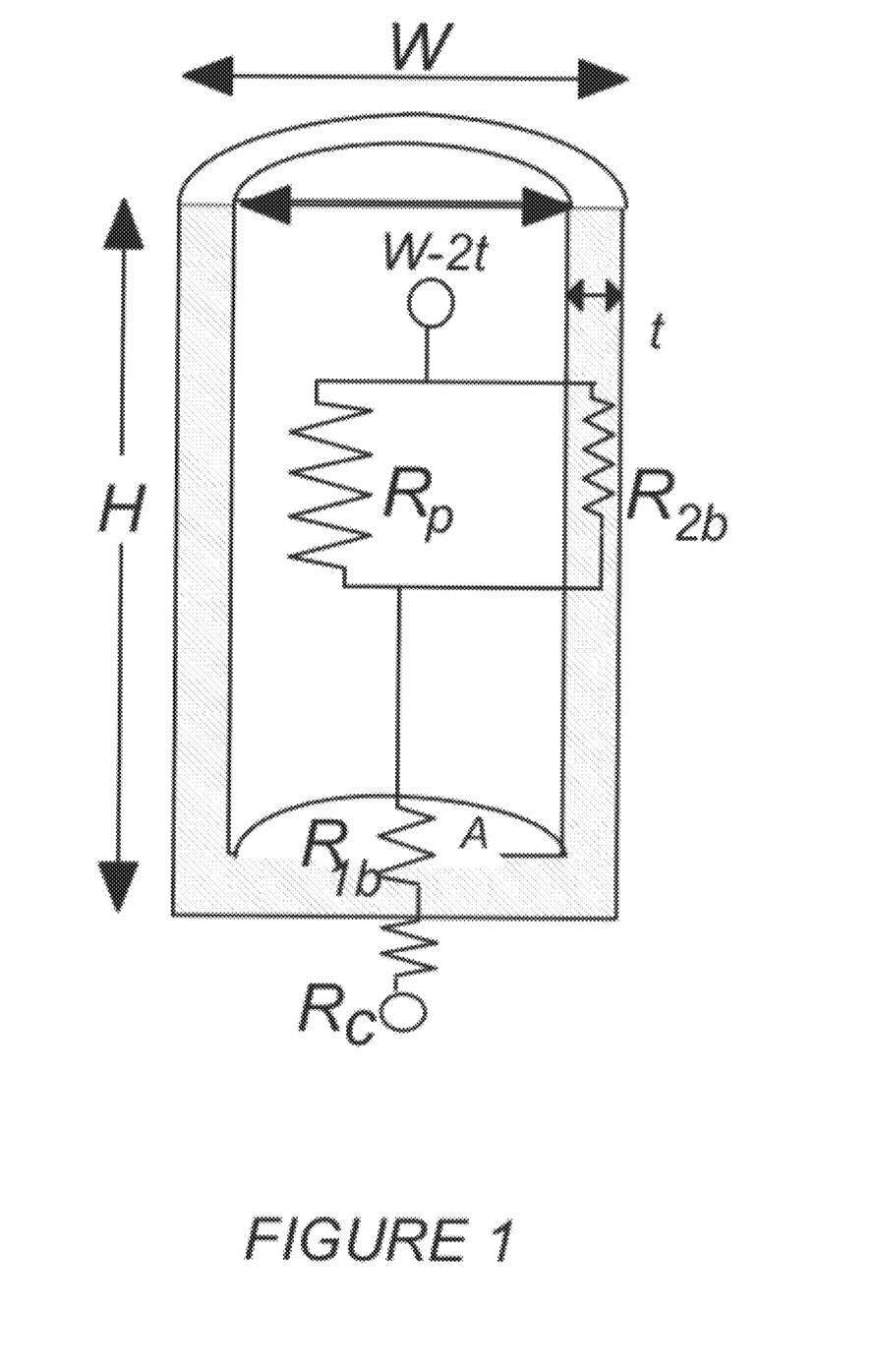
FIG. 1 is a basic diagram showing contributions to the resistance of a contact via.
Figure 2:
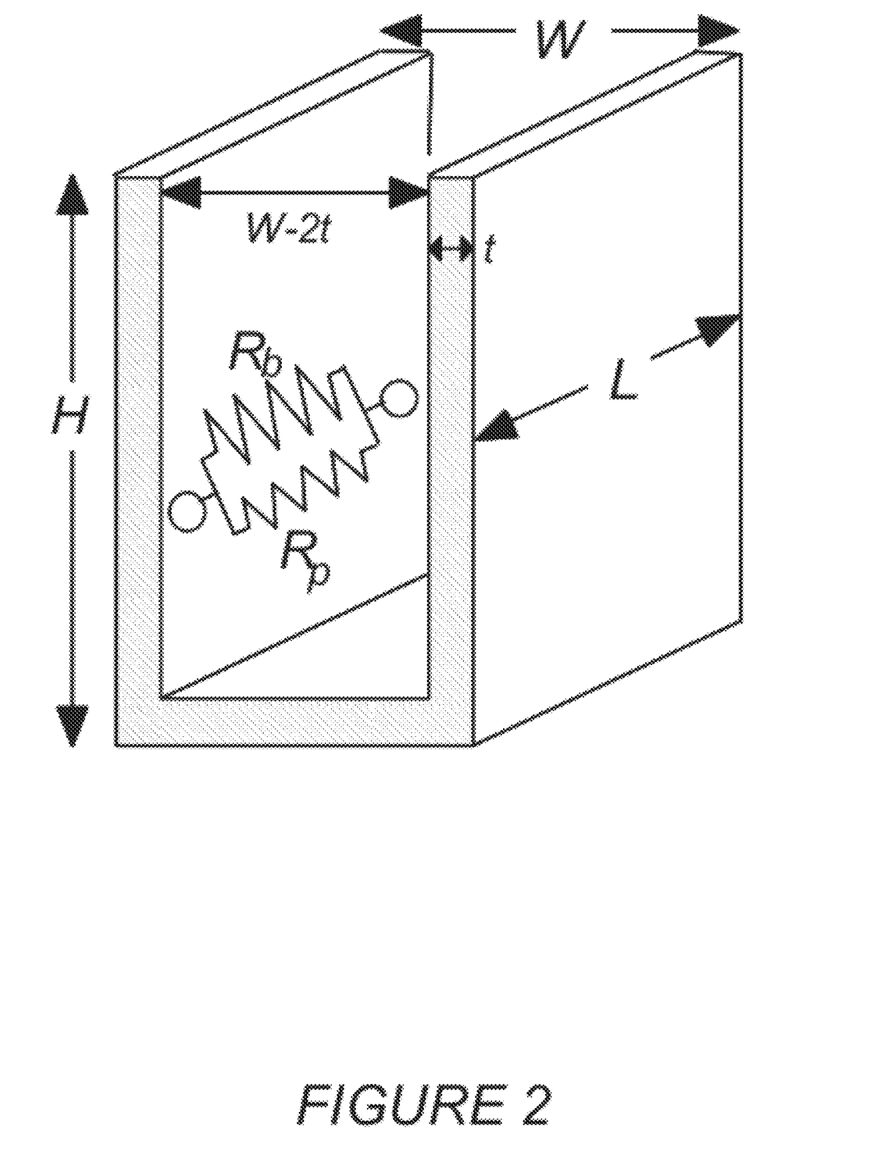
FIG. 2 is a basic diagram showing contributions to the resistance of a line.

FIG. 1a is a basic diagram showing contributions to the resistance of a contact via. $R_c$ indicates contact resistance;

$R_{1b}$ and $R_{2b}$ the resistance of the barrier layer between the contact and plug; $R_p$ the resistance of the plug; and $R_3$ the resistance of the barrier layer as it extends the length of the plug. Total resistance is given as $R_{total}=R_c+R_{1b}+(1/R_p+1/R_{2b})^{-1}$. Resistance is equal to $\rho L/A$, where $\rho$ is the resistivity of the material, L is the length of the layer in the direction of the current flow and A is the cross-sectional area perpendicular to current flow. Thus $R_{b1}=4\rho_b t/[\pi(w-2t)^2]$; $R_p=\rho(H-t)/A_2$; $A_2=\pi[(w/2)^2-(w/2-t)^2]$; and $R_{b2}=\rho_b(H-t)/[\pi(w/2-t)^2]$. FIG. 1$b$ is a basic diagram showing contributions to the resistance of a line. Current flows along the length of the line, so the total resistance is given by $R_{total}=(1/R_{line}+1/R_b)^{-1}$. Here $R_{line}=\rho L/[(w-2t)(H-t)]$ and $R_b=\rho_b L/[2Ht+(w-2t)(t)]$.

As feature sizes decrease, the contribution of the barrier to the overall resistance increases. Barrier layers are conventionally Ti/TiN. However, as devices shrink and the barrier contribution ($R_{1b}$ and $R_{2b}$) to the resistance becomes significant, Ti/TiN becomes less favorable. To minimize resistance of lines and via/contacts, the barrier layer should be have low resistivity ($\rho_b$) and be very thin. The barrier layer also should have excellent adhesion to the underlying contact material as well as the tungsten plug. Conventional stacks use titanium/titanium nitride (Ti/TiN) as diffusion barriers, however various issues arise with Ti/TiN as feature size decreases, including poor step coverage for PVD TiN. There is no viable ALD process of TiN for low temperature or low chlorine-based content. Chlorine-containing compounds may attack the underlying surface. Moreover, as the TiN barrier is thinned to meet scalability requirements, the barrier properties deteriorate and the underlying Ti layer and/or the contact material is exposed to fluorine from typical tungsten deposition processes. Tungsten nitride (WN) has also been used as a diffusion barrier; however WN is also typically deposited with halogen-based chemistries that can attack the underlying surface.

The present invention provides ultra-thin low resistivity tungsten-rich barrier layers having excellent adhesion and step coverage. The tungsten-rich layers are at least 50 atomic % tungsten (including metallic tungsten (W) and tungsten-containing compounds such as tungsten carbide). In many embodiments, the layers are a mix of tungsten and tungsten carbide (WC).

Figure 3A:
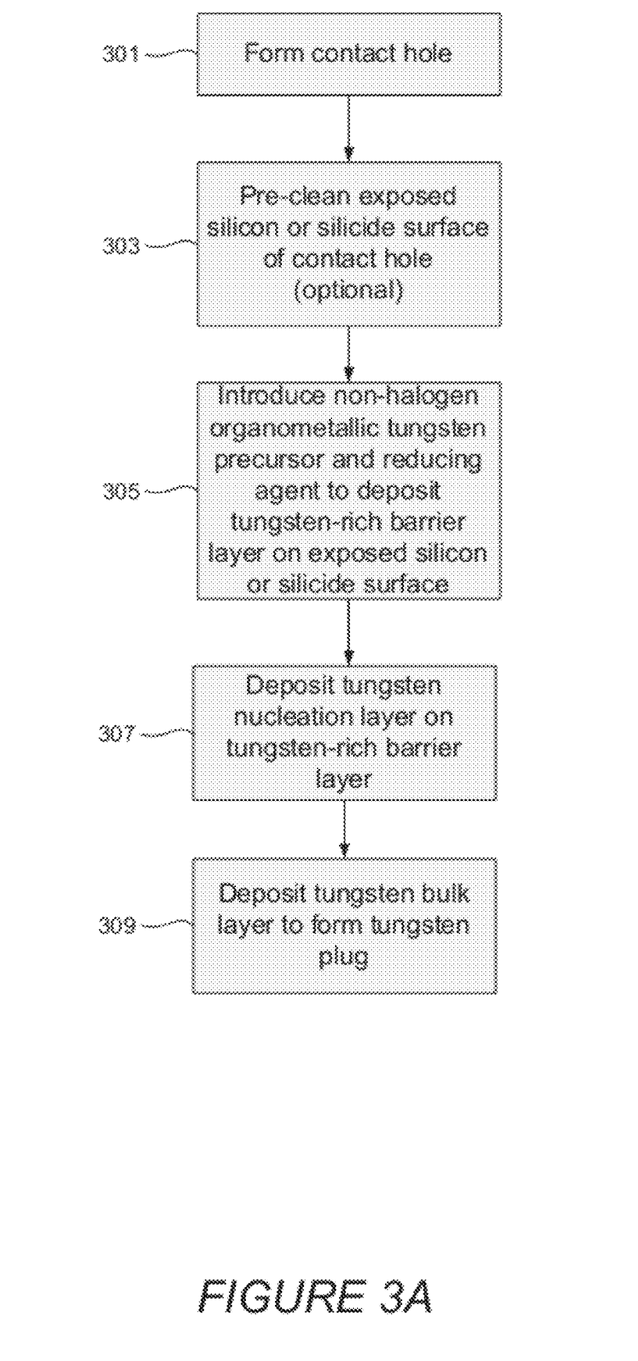
FIG. 3a is a process flowsheet showing important operations in depositing an all-tungsten plug according to certain embodiments.

FIG. 3$a$ is a process flow sheet showing major operations in a method of forming a tungsten plug. First, in an operation 301, a contact hole is formed, typically in a silicon oxide layer, to expose an underlying conductive region. The conductive region may be a silicon or silicide source and/or drain region, including Si, Si/Ge, NiSi, CoSi, etc., although in certain embodiments the conductive region may also be an underlying metal layer. The exposed conductive material (e.g., a silicon or silicide source/drain or metal layer) is optionally cleaned (303). At this point, an ultra-thin tungsten-rich layer is deposited by exposing the contact hole to a halogen-free tungsten-containing organometallic precursor and a reducing agent (305). The layer may be deposited any appropriate method, including by simultaneously exposing the contact hole to the organometallic precursor and reducing agent in a chemical vapor deposition type process or by introducing alternating pulses of the organometallic precursor and reducing agent in an atomic layer deposition (ALD) or pulsed nucleation layer (PNL) type process. Reducing agents include but are not limited to hydrogen, ammonia, methane, ethane, ethylene and silanes. In ALD type processes, the reducing agent may be activated (e.g., atomic hydrogen) or non-activated. Activated reducing agent species may be produced by direct or remote plasma generators, thermal crackers, etc. Ion-induced ALD, iALD, may be used. The deposited film is a tungsten-rich film, and in certain embodiments, a mixture of tungsten and tungsten carbide. Oxygen and nitrogen may also be present in the film. The film is deposited to conform to the contact hole and to the desired thickness. As indicated above, very thin layers are desirable, e.g., as low as between about 10-20 angstroms. This is possible because the tungsten-rich organometallic films (including W/WC films) have been shown to be continuous and have good adhesion at these thicknesses. Resistivity is comparable or better than tungsten nitride or titanium nitride barrier layers, as discussed further below. After depositing the tungsten-rich layer, a tungsten nucleation layer is deposited in an operation 307. This may be done by a PNL or ALD process. The bulk tungsten layer is then deposited by a CVD process, forming the plug (309). A halogen-containing precursor (WF6) is typically used for the nucleation and bulk tungsten deposition processes. In certain embodiments, the CVD bulk layer is deposited directly on the tungsten-rich barrier layer, without an intervening nucleation layer deposition. After forming the tungsten plug, subsequent processing operations are performed, e.g., chemical mechanical planarization, etchback, or patterning.

Figure 3B:
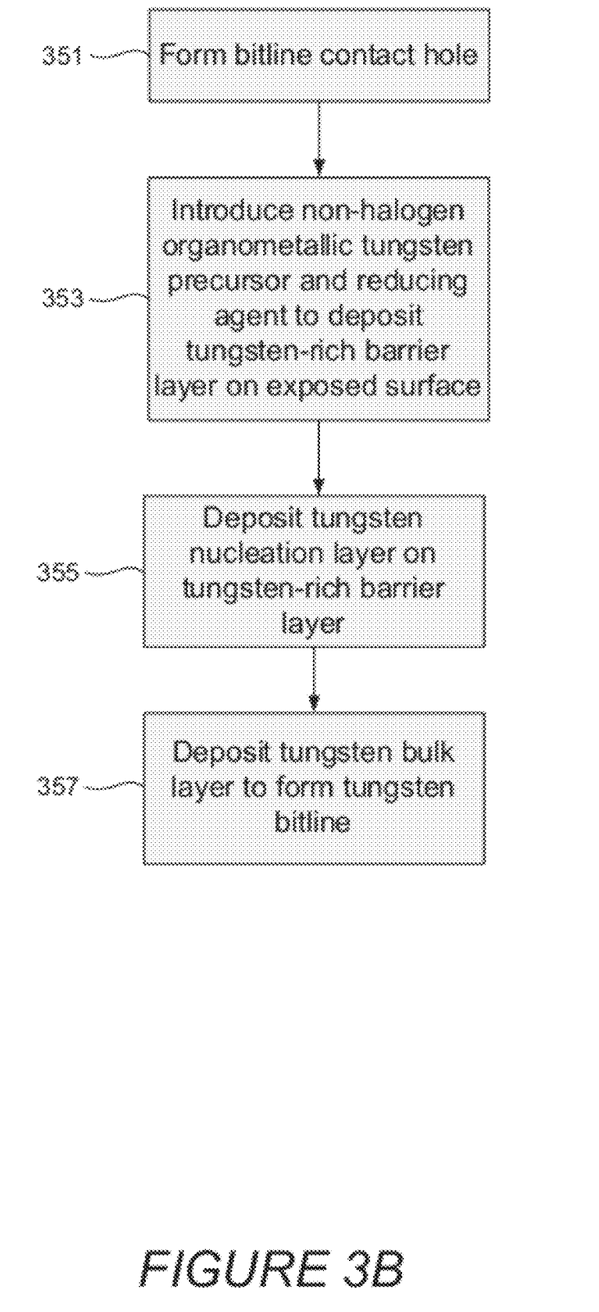
FIG. 3b is a process flowsheet showing important operations in depositing an all-tungsten line according to certain embodiments.
Figure 3C:
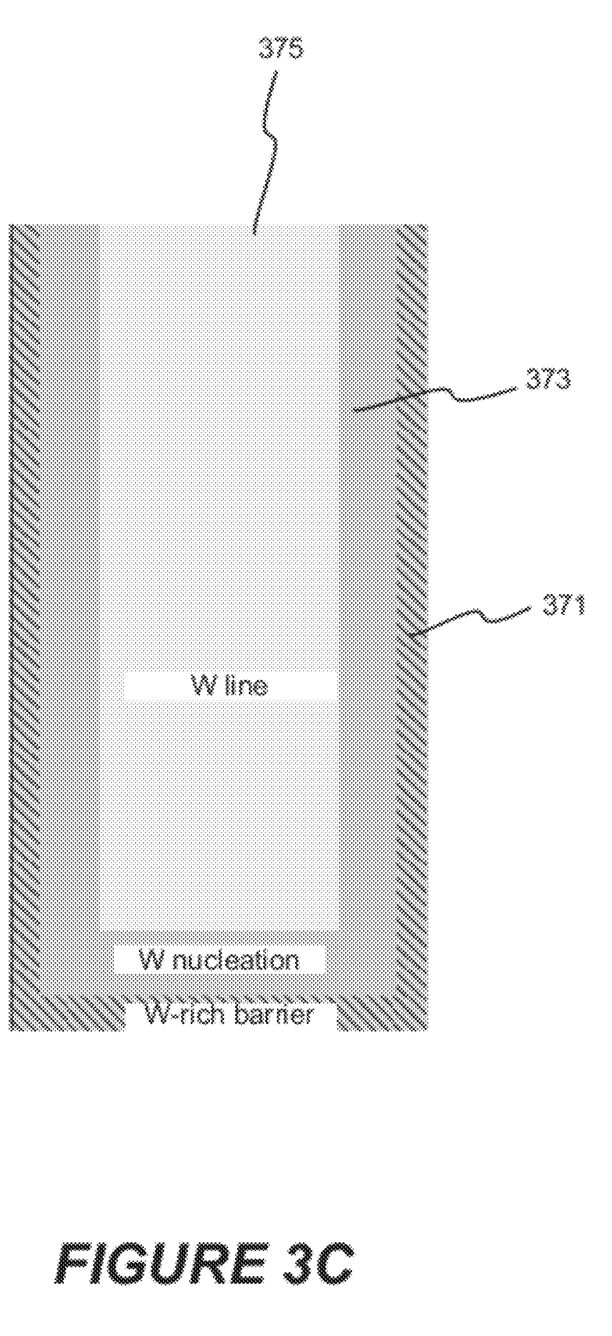
FIG. 3c is a schematic diagram showing a cross-section of an all-tungsten line according to certain embodiments.

FIG. 3$b$ is a process flowsheet illustrating operations in a method for forming damascene tungsten bitline stacks. A bitline contact hole is formed in a dielectric layer, exposing a conductive region of the underlying substrate (351). The bitline may include both contacts to active regions as well as to underlying metal layers. Instead of depositing a Ti/TiN as a liner/barrier, a very thin tungsten-rich layer is deposited, which acts as barrier (353). Subsequent tungsten nucleation and tungsten bulk deposition processes are performed to form the bitline. See 355 and 357. After forming the bitline, subsequent processing operations are performed. These typically include either CMP or liner deposition followed by photopatterning and dryetch to form the tungsten lines. The tungsten-rich films are particularly appropriate for bitline applications in which thin tungsten films (<500 angstroms) are desired. Because the total thickness (H in FIG. 1$b$) is small, the barrier contributes more to the total resistance. The ultrathin, low-resistivity tungsten-rich barrier films described herein provide lower resistance than TiN films. FIG. 3$c$ is a schematic of a cross-section of the line. The tungsten-rich barrier layer is at 371, a tungsten nucleation layer at 373 and the bulk tungsten at 375. The entire line is comprised of tungsten rich films. As indicated above, tungsten nucleation layer 373 is typically a PNL or ALD layer and tungsten bulk layer 375 is deposited in a CVD process. Also in certain embodiments, layer 373 may not be present. The bitline or other tungsten lines may also be formed by depositing a blanket tungsten film followed by patterning and dry etch of the tungsten or by a combination of damascene and post tungsten deposition patterning and etch.

Organometallic Tungsten (OMW) Precursors

In general, the tungsten-rich films are deposited from organometallic tungsten precursors. The organometallic tungsten precursor is a halogen-free compound that may contain oxygen and nitrogen. Some examples of such compounds include but are not limited to tungsten hexacarbonyl, ethylcyclopentadienyl dicarbonyl nitrosyl tungsten, ethylcyclopentadienyl dihydrogen tricarbonyl, Bis(tert-butylimino) bis(dimethylamino) tungsten. According to various embodiments, OMW precursor may be aliphatic or aryl, including any of alkyl, alkenyl, alkynyl and phenyl groups. The OMW precursor may also have carbon and/or nitrogen, e.g., in the form of carbonyl, nitrosyl and amino groups.

In certain embodiments, the organometallic tungsten precursor may be introduced with a co-reactant, e.g., a carbon or nitrogen containing compound, to tune the composition of the deposited film. Also, in certain embodiments, non-organic compounds such as $W(CO)_6$, as well as organic derivatives of $W(CO)_6$ may be used. Importantly, the precursor used does not have a halogen. This is because the underlying silicon/silicide is vulnerable to attack by halogen-containing precursors such as $WF_6$ (commonly used in tungsten deposition).

Composition and Properties of Tungsten-Rich Film

Figure 4:
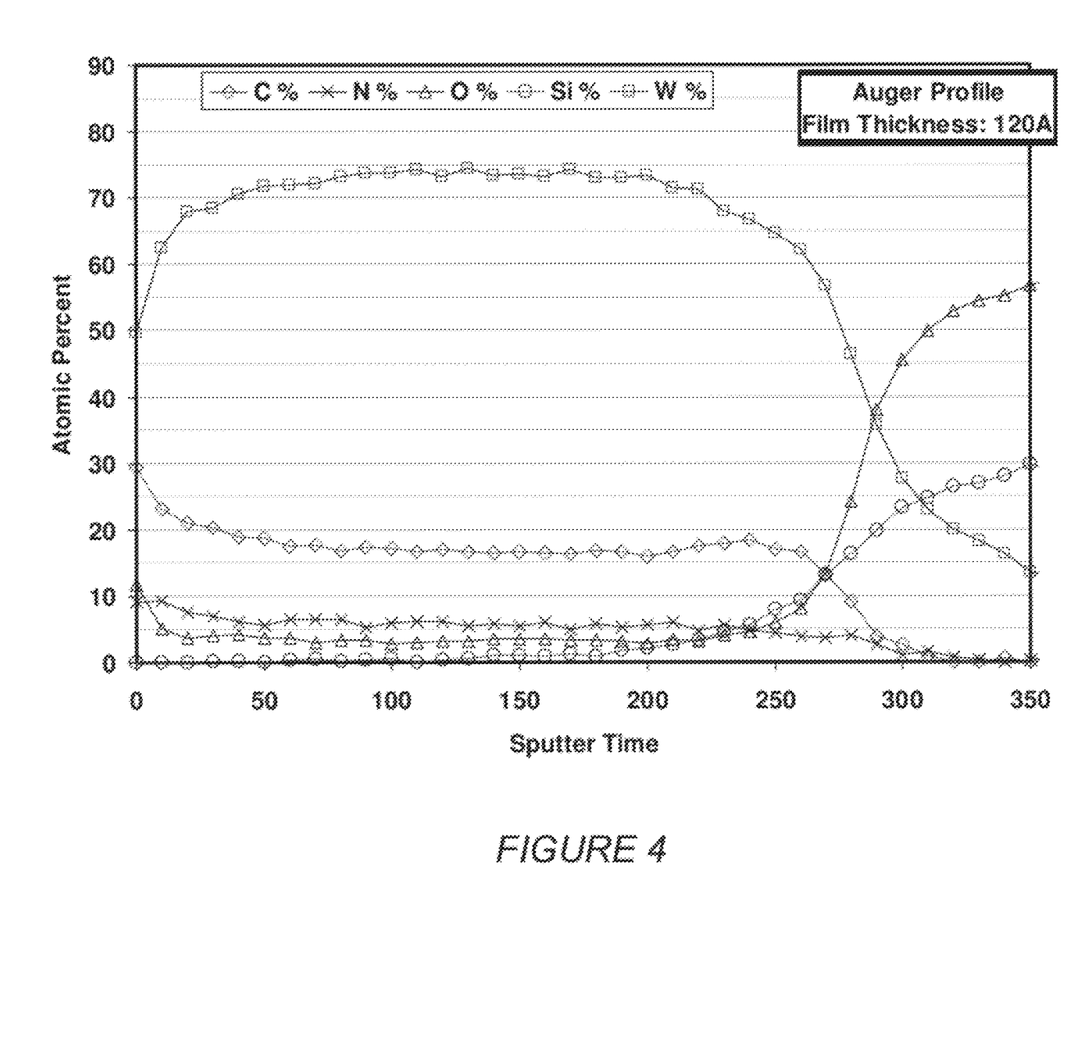
FIG. 4 is a graph showing composition of a stack including a 120 angstrom thick tungsten-rich film formed from an organometallic precursor on silicon oxide. Sputter time correlates with film depth.

The deposited organometallic tungsten (OMW) film is tungsten rich, having at least 50% (atomic) tungsten. In many embodiments, the tungsten-rich film is a mixture of metallic or elemental tungsten (W) and tungsten carbide (WC). Depending on the precursor and deposition conditions, the film may also contain oxygen and nitrogen. WC and nitrogen and oxygen impurities typically account for about 0-50% of the film. FIG. 4 shows the composition of an organometallic film deposited from ethylcyclopentadienyl dicarbonyl nitrosyl tungsten. As can be seen from the figure, the layer has >70% tungsten, with about ~17% carbon, ~5% nitrogen and <5% oxygen. With substantially all of the carbon in the form of carbide, the film is about 3:1 metallic tungsten (W) to tungsten carbide (WC). Some amount of ditungsten carbide ($W_2C$) may also be present.

According to various embodiments, the percent (atomic) composition is: about 50-100% tungsten; about 0-50% carbon; about 0-10% nitrogen; and about 0-10% oxygen. More particularly, the percent (atomic) composition is about 60-100% tungsten; about 10-30% carbon, <10% nitrogen and <10% oxygen. Metallic (elemental) tungsten dominates the film, with at least 50% of the tungsten being present as metallic.

Other data shows that the portion of the film that is not metallic (elemental) W is dominated by WC. In certain embodiments, the W:WC (molecular) ratio is between about 2:1-9:1, or about 3:1-7:1; 4:1-6:1; or about 3:1-5:1. In certain embodiments, substantially all of the carbon in the film is in the form of carbide. In certain embodiments, the film consists essentially of tungsten and tungsten carbide. In certain embodiments, the film consists essentially of tungsten, tungsten carbide and nitrogen and/or oxygen. In certain embodiments other elements may be present as the minor component including nitrogen, oxygen, phosphorous, sulfur, silicon germanium and boron.

As described further below, the ratio of elemental tungsten to tungsten carbide is important: too little carbide results in high roughness and poor adhesion; too much carbide may result in high resistivity and difficulty during CMP.

In certain embodiments, the film composition may be tuned by using a hydrogen or other reducing agent plasma, for example, in an ALD process. It has been found that in an ALD process of alternating pulses of organometallic precursor and H plasma exposure, increasing the plasma dose time increased the amount of carbide, while decreasing the amount of nitrogen and oxygen in the final film. This indicates that the plasma results in converting carbon to carbide, and removing oxygen and nitrogen. In certain embodiments, a co-reactant may also be used in conjunction with the organometallic precursor to tune the film properties.

The deposited film acts as a diffusion barrier film between the tungsten and underlying conductive region. The tungsten-rich film also adheres well to the silicon/silicide—meaning that is can function as an adhesion layer or liner, unlike TiN films which typically need titanium adhesion films. Both wet and dry adhesion as measured by scribe tape tests with thick CVD W on 20-50 angstrom thick organometallic tungsten films was found to be excellent. Without being bound by a particular theory, it is believed that the carbide linkages help anchor the film to the underlying oxide and to the tungsten on top, providing excellent adhesion. This allows very thin layers of the tungsten-rich film to be deposited.

Figure 5:
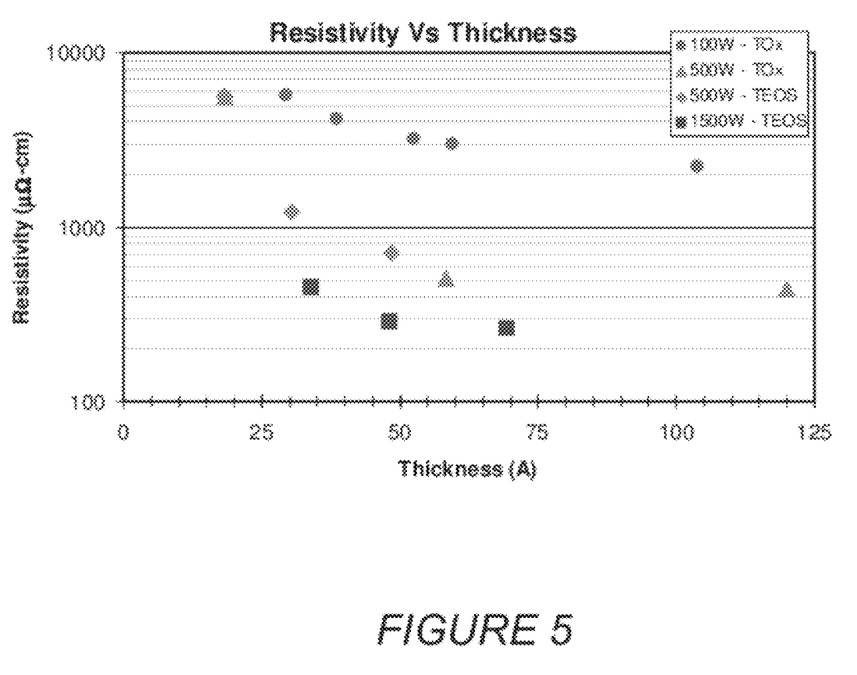
FIG. 5 is a graph showing resistivity as a function of thickness for various tungsten-rich films formed according to certain embodiments.

Resistivity of the film is low; resistivity for a 50 angstrom film deposited from ethylcyclopentadienyl dicarbonyl nitrosyl tungsten was found to be on the order of 100-400 $\mu\Omega$-cm. This is comparable or lower than both WN and TiN films of same thickness. FIG. 5 shows film resistivity data for organometallic films deposited on thermally grown silicon dioxide.

Film thickness affects resistivity as well as overall resistance, as can be seen in Figure. Resistivity increases at very low thicknesses due to boundary effects, and as described, the resistance of the film depends on film thickness as well as resistivity. Depending on the particular application, a film thickness that results in a low overall resistance is used. Importantly, FIG. 5 also shows that a sheet resistance is measurable at as low 10 angstroms—this means that the film in continuous at these ultrathin thicknesses—about 5 atomic layers. According to various embodiments, the tungsten-rich film may be between 10 angstroms and 500 angstroms or between 10 angstroms and 50 angstroms or between 10 angstroms and 30 angstroms.

The tungsten-rich films are also very smooth; the RMS roughness of a tungsten-rich film deposited on an oxide was measure to be about 0.304—as compared to 0.25 the oxide control. In addition, it is found that the roughness remains constant as the film grows (0.304 for 30 angstrom film on oxide, 0.307 for a 50 angstrom film on oxide), unlike most films in which the roughness increases with film growth. This indicates that the OMW films are fairly small-grained. Often with WN or W films are very rough at small thicknesses because they grow large grains. Without being bound by a particular theory, it is believed that the carbide present in the tungsten-rich film breaks up the grains, providing smooth films.

As discussed above, in certain embodiments, the tungsten-rich films are W and WC mixture, dominated by elemental tungsten. Without being bound by a particular theory, it is believed that the presence of carbide functions to stuff the grain boundaries and give improved barrier performance.

As indicated above, in certain embodiments the OMW films eliminate the need for Ti/TiN and other barrier films in tungsten plug fill or bit line schemes. Other barrier films that have been used instead of TiN include WN—these films have 2:1-1:1 W:N atomic ratios. The tungsten rich barrier films described above are advantageous over Ti/TiN or WN barrier films in certain applications for several reasons:

1) Able to deposit by low-temperature CVD or ALD methods. There are no feasible high throughput, low operating cost CVD TiN methods, and no low-temperature ALD TiN methods. PVD methods have poor step coverage.
2) Halogen-free deposition chemistry. Conventional Ti/TiN CVD or ALD deposition chemistry is chlorine-based ($TiCl_4$). Conventional WN deposition chemistry is fluorine-based $WF_6$. Fluorine and chlorine attack can be a problem for certain contacts. Non-fluorine sources of WN have not been successful at obtaining good films.
3) Good adhesion. As indicated above, the tungsten-rich films (W/WC) have excellent adhesion at thicknesses as low as 10-15 angstroms. This is significant; for example, WN barrier films require at least 60 angstroms to get good adhesion in certain applications. Thinner barrier layers lower the overall resistance—especially in small features. TiN also has poor adhesion, often requiring a Ti layer to improve adhesion.

4) Continuous at low thicknesses. The tungsten-rich barriers are continuous and provide good step coverage at thicknesses as low as 10-15 angstroms.

5) Low resistivity and resistance. The tungsten-rich barriers have resistivity comparable to or better than TiN and WN at similar thicknesses. Because the tungsten-rich barrier films can be deposited at very thin thicknesses (thinner than WN and TiN), the overall resistance is lower than for conventional films.

Another advantage of the tungsten-rich barrier films is that they are well-suited to being deposited in the same processing tool as PNL or CVD tungsten. This is not true of Ti/TiN barriers, which are typically deposited by PVD.

Other Embodiments

While the tungsten-rich films have been described in the context of providing low resistivity tungsten plug and line applications, the tungsten-rich film may also have other applications, particularly in tungsten film stacks. In one embodiment, the tungsten-rich film may be deposited on an exposed conductive region as described above, with tungsten nitride then deposited on top of it, e.g., as a barrier film in a tungsten plugfill or bitline application. In this application, tungsten nitride serves as a barrier film and the OMW tungsten-rich layer protects the underlying region from fluorine attack during the $WF_6$ tungsten nitride deposition and improves adhesion.

Apparatus

The methods of the invention may be carried out in various types of deposition apparatus available from various vendors. Examples of suitable apparatus include a Novellus Concept 2 Altus, a Concept-2 Altus-S, a Concept 3 Altus deposition systems, a concept 3 Inova deposition system, all available from Novellus Systems, Inc. of San Jose, Calif., or any of a variety of other commercially available CVD processing systems. In some cases, the process can be performed in single chambers as described in e.g. U.S. Pat. No. 6,977,014, which is incorporated herein by reference for all purposes. In some cases, the process can be performed on multiple deposition stations sequentially. See, e.g., U.S. Pat. No. 6,143,082, which is incorporated herein by reference for all purposes. In some embodiments, the tungsten-rich barrier deposition process is performed at a first station or at first and second stations that are one of two, four, five or even more deposition stations positioned within a single deposition chamber. The reducing gases and the organometallic precursor may be ately introduced to the surface of the semiconductor substrate at the first station, using an individual gas supply system that creates a localized atmosphere at the substrate surface.

Figure 6:
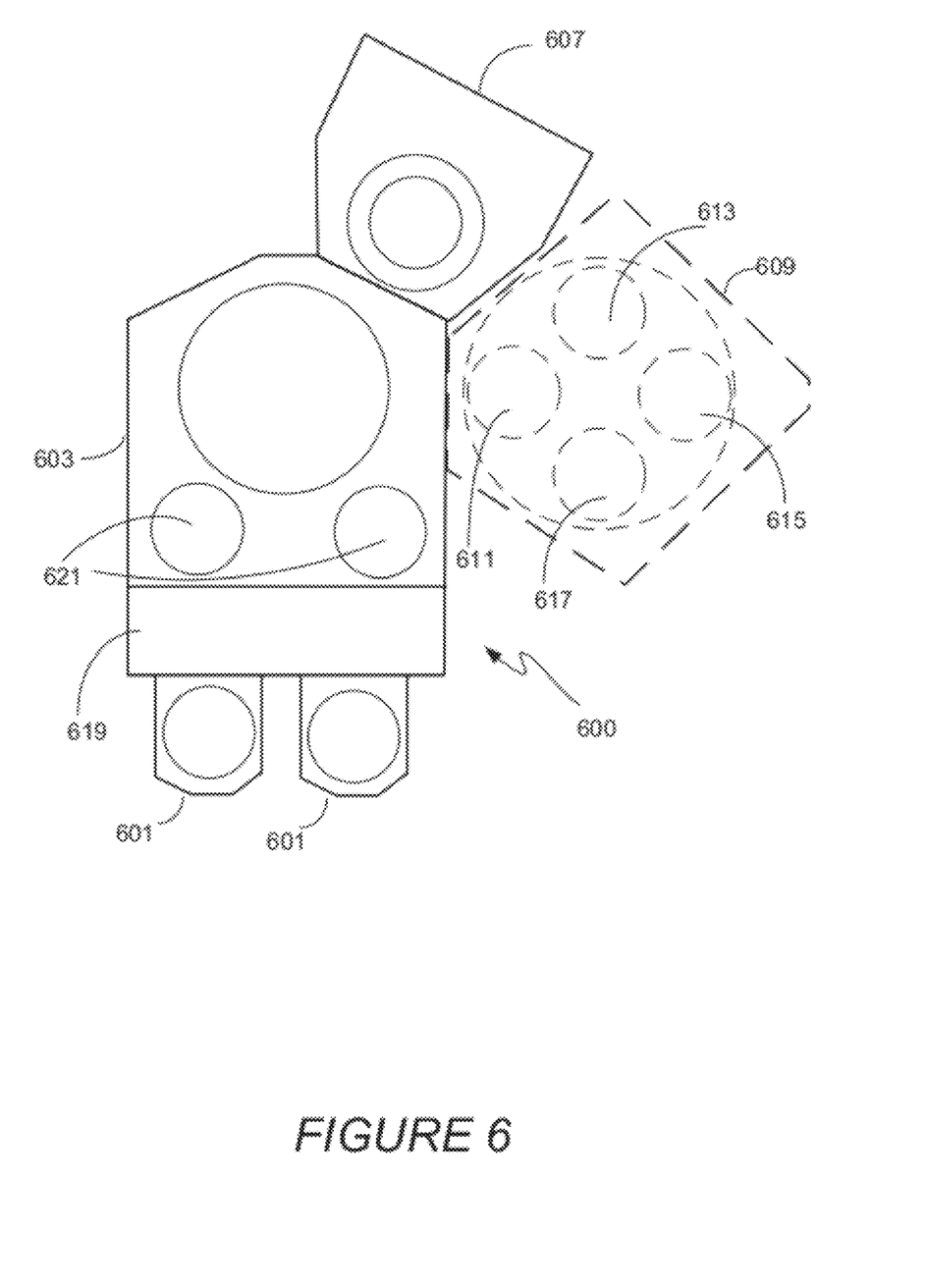
FIG. 6 is a schematic illustration showing an apparatus suitable for forming all-tungsten plugs and lines.

FIG. 6 is a block diagram of a CVD processing system suitable for conducting tungsten thin film deposition processes in accordance with embodiments of the invention. The system 600 includes a transfer module 603. The transfer module 603 provides a clean, pressurized environment to minimize the risk of contamination of substrates being processed as they are moved between the various reactor modules. Mounted on the transfer module 603 is a multi-station reactor 609 capable of performing PNL deposition and CVD according to embodiments of the invention. Chamber 609 may include multiple stations 611, 613, 615, and 617 that may sequentially perform these operations. For example, chamber 609 could be configured such that station 611 performs PNL deposition, station 713 performs multi-pulse reducing agent treatment, and stations 615 and 617 perform CVD.

Also mounted on the transfer module 603 may be one or more single or multi-station modules 607 capable of performing plasma or chemical (non-plasma) pre-cleans. The module may also be used for various other treatments, e.g., post liner tungsten nitride treatments. The system 600 also includes one or more (in this case two) wafer source modules 601 where wafers are stored before and after processing. An atmospheric robot (not shown) in the atmospheric transfer chamber 619 first removes wafers from the source modules 601 to loadlocks 621. A wafer transfer device (generally a robot arm unit) in the transfer module 603 moves the wafers from loadlocks 621 to and among the modules mounted on the transfer module 603.

In certain embodiments, a system controller is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of embodiments of the invention in a single or multi-chamber semiconductor processing tool.

While this invention has been described in terms of a few preferred embodiments, it should not be limited to the specifics presented above. Many variations on the above-described preferred embodiments may be employed. Therefore, the invention should be broadly interpreted with reference to the following claims.

The invention claimed is:

1. A method of filling a contact hole in a dielectric layer on a substrate, the contact hole exposing a conductor, the method comprising:
    flowing a non-halogen organometallic tungsten precursor and a reducing agent into a reactor housing the substrate, wherein the non-halogen organometallic tungsten precursor and the reducing agent are different compounds; and
    exposing the substrate to the non-halogen organometallic tungsten precursor and the reducing agent to thereby deposit a tungsten-rich film directly on at least the exposed conductor.

2. The method of claim 1, further comprising substantially filling the contact hole with tungsten to form a tungsten plug.

3. The method of claim 1, further comprising exposing the substrate to a tungsten-containing precursor to deposit one or more tungsten layers on the tungsten-rich film.

4. The method of claim 3, wherein exposing the substrate to a tungsten-containing precursor to deposit one or more tungsten layers on the tungsten-rich layer comprises depositing a tungsten nucleation layer on the tungsten-rich film, and depositing a bulk tungsten film on the tungsten nucleation layer.

5. The method of claim 1, wherein flowing the non-halogen organometallic tungsten precursor and the reducing agent comprises introducing alternating pulses of the organometallic precursor and the reducing agent to the reactor.

6. The method of claim 1, wherein the substrate is simultaneously exposed to vapor phases of the organometallic precursor and the reducing agent.

7. The method of claim 1, wherein the tungsten-rich film comprises metallic tungsten (W) and at least one tungsten-containing compound.

8. The method of claim 1, wherein the tungsten-rich film comprises metallic tungsten (W) and tungsten carbide (WC).

9. The method of claim 8, wherein the molecular ratio of metallic tungsten (W) to tungsten carbide (WC) ranges from about 2:1 to 10:1.

10. The method of claim 8, wherein the molecular ratio of metallic tungsten (W) to tungsten carbide (WC) ranges from about 2:1 to 4:1.

11. The method of claim 1, wherein the tungsten-rich film comprises at least about 60 atomic percent tungsten.

12. The method of claim 1, wherein the non-halogen organometallic tungsten precursor comprises at least one of the group consisting of alkyl, alkenyl, alkynyl and phenyl groups.

13. A method of forming an all-tungsten line in a trench in the layer of dielectric material to a reactor, said trench having a trench bottom and sidewalls, the method comprising:
    flowing a non-halogen organometallic tungsten precursor and a reducing agent into the reactor, wherein the non-halogen organometallic tungsten precursor and the reducing agent are different compounds;
    exposing the substrate to the non-halogen organometallic tungsten precursor and the reducing agent to thereby deposit a tungsten-rich film directly on at least the trench bottom and sidewalls; and
    substantially filling the trench with tungsten to form an all-tungsten line configured to have current flow along its length.

14. The method of claim 13, further comprising exposing the substrate to a tungsten-containing precursor to deposit one or more tungsten layers on the tungsten-rich film.

15. The method of claim 13, wherein flowing the non-halogen organometallic tungsten precursor and the reducing agent comprises introducing alternating pulses of the organometallic precursor and the reducing agent to the reactor.

16. The method of claim 13, wherein the substrate is simultaneously exposed to vapor phases of the organometallic precursor and the reducing agent.

17. The method of claim 13, wherein the tungsten-rich film comprises metallic tungsten (W) and at least one tungsten-containing compound.

18. The method of claim 13, wherein the tungsten-rich film comprises a mixture of metallic tungsten and at least one tungsten compound.

19. The method of claim 13, wherein the tungsten-rich film comprises a mixture of metallic tungsten and tungsten carbide.

20. The method of claim 13, wherein the non-halogen organometallic tungsten precursor comprises at least one of the group consisting of alkyl, alkenyl, alkynyl and phenyl groups.

* * * * *